United States Patent [19]

Mori et al.

[11] Patent Number: 4,880,995

[45] Date of Patent: Nov. 14, 1989

[54] ELECTRICALLY ISOLATED MOSFET DRIVE CIRCUIT

[75] Inventors: Satoshi Mori, Takarazuka; Gourab Majumdar, Itami, both of Japan

[73] Assignee: Mitsubishi Denki Kabushiki Kaisha, Tokyo, Japan

[21] Appl. No.: 233,855

[22] Filed: Aug. 18, 1988

Related U.S. Application Data

[63] Continuation of Ser. No. 802,367, Nov. 27, 1985, abandoned.

[30] Foreign Application Priority Data

Nov. 29, 1984 [JP] Japan .................................. 59-253286

[51] Int. Cl.$^4$ .......................... A03K 3/01; A03K 3/26
[52] U.S. Cl. ................................ 307/270; 307/247.1; 307/255; 307/311; 307/443
[58] Field of Search ............... 307/270, 280, 300, 585, 307/579, 253, 574, 446, 311, 247.1, 255

[56] References Cited

U.S. PATENT DOCUMENTS

| | | | |
|---|---|---|---|
| 3,649,851 | 3/1972 | Cohen | 307/270 |
| 4,149,098 | 4/1979 | Wright | 307/270 |
| 4,414,479 | 11/1983 | Foley | 307/315 |
| 4,540,893 | 9/1985 | Bloomer | 307/270 |
| 4,654,544 | 3/1987 | Wheeler | 307/270 |

FOREIGN PATENT DOCUMENTS 2910889  3/1979  Fed. Rep. of Germany .
0172829  9/1984  Japan .................................. 307/270

OTHER PUBLICATIONS

"Switching Phenomena and Base Drive Design", by Tinus van de Wouw, PCI '81 Proceedings, pp. 58-71.

Primary Examiner—Stanley D. Miller
Assistant Examiner—Timothy P. Callahan
Attorney, Agent, or Firm—Birch, Stewart, Kolasch & Birch

[57] ABSTRACT

A driver circuit for driving a switching element in response to a driving signal from a driving signal generator includes an electrical isolation circuit for generating an electrically isolated signal from the driving signal in response to the driving signal; a first signal generator which receives the electrically isolated signal, and generates a first signal which level-changes from a second level to a third level in response to the level change of the electrically isolated signal from a first level to the second level; a second signal generator which receives the electrically isolated signal, and generates a second signal synchronous with the electrically isolated signal; a third signal generator which receives the signal from the first signal generator, and generates a third signal synchronous with the first signal; a fourth signal generator which receives the signals from the second and the third signal generators, and generates a fourth signal having a signal level equal to the sum of the second and the third signal levels, the generator including a metal oxide semiconductor field effect transistor.

5 Claims, 4 Drawing Sheets

F I G .5.
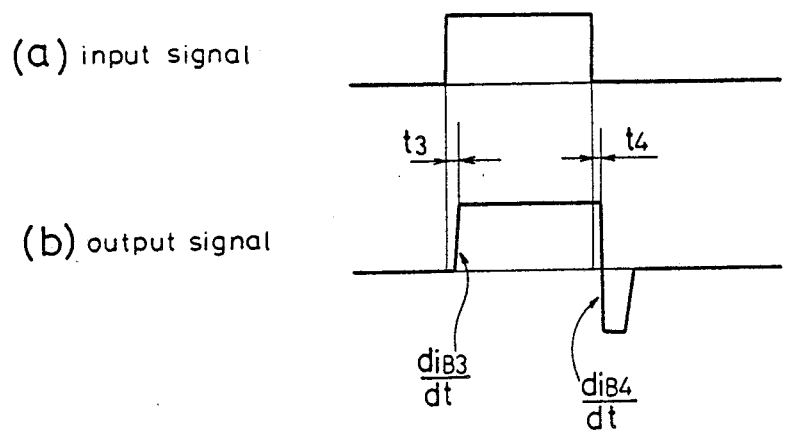

ELECTRICALLY ISOLATED MOSFET DRIVE CIRCUIT

This application is a continuation of application Ser. No. 06/802,367 filed on Nov. 27, 1985, now abandoned.

FIELD OF THE INVENTION

The present invention relates to a driver circuit, especially to a circuit for driving a switching element.

BACKGROUND OF THE INVENTION

A prior art switching element such as a high power bipolar transistor conducts a switching operation in response to a signal from a driver circuit.

FIGS. 4 and FIG. 5 show waveforms of input and output signals in a prior art driver circuit and in an ideal driver circuit, respectively.

As apparent from the comparison between the waveforms shown in FIG. 4 and 5, the delay times $t_1$, $t_2$ in between the response of the output signal (refer to FIG. 4 (b)) against the input signal (refer to FIG. 4 (a)) in the prior art driver circuit are both longer than those of the ideal case ($t_1 > t_3$, $t_2 > t_4$), and the rate of the rise time of the output signal $di_{B1}/dt$ and the rate of the fall time of the output signal $di_{B2}/dt$ are both smaller than those of the ideal case (($di_{B1}/dt) < (di_{B3}/dt)$, ($di_{B2}/dt) < (-di_{B4}/dt)$). Furthermore, the time for converting a bias current into a reverse bias current is undesirably long.

Another prior art driver circuit is disclosed in an article entitled "SWITCHING PHENOMENA AND BASE DRIVE DESIGN" by TINUS VAN DE WOUW, PHILIPS SEMICONDUCTORS, PCI PROCEEDINGS, 1981. In this article it is disclosed "for a fast turn-on..., the base current should rise faster than the collector current," "A Darlington has a special property that the input transistor infact desaturates the output transistor...," and "if the input transistor is overdriven too much, a tail in the turn-off appears... . This tail is caused by the driver."

SUMMARY OF THE INVENTION

The present invention is directed to solve the problems pointed out above, and has for its object to provide a driver circuit capable of improving the response of the rise and fall times of the output signal.

Another object of the present invention is to provide a driver circuit capable of making the output current a constant level.

Yet another object of the present invention is to provide a driver circuit capable of interfacing by TTL logic.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a driver circuit for driving a switching element in reponse to a driving signal from a driving signal generator, which comprises: an electrical isolation circuit for generating a signal electrically isolated from the driving signal in response to the driving signal; a first signal generator which receives the electrically isolated signal, and generates a first signal which level-changes from a second level to a third level in response to the level change of the electrically isolated signal from a first level to the second level; a second signal generator which receives the electrically isolated signal, and generates a second signal synchronous with the electrically isolated signal; a third signal generator which receives the signal from the first signal generator, and generates a third signal synchronous with the first signal; a fourth signal generator which receives the signals from second and third signal genertors, and generates a fourth signal having a signal level equal to the sum of the levels of the second and third signal levels, the generator including a metal oxide semiconductor field effect transistor.

BRIEF DESCRIPTION OF THE DRAWINGS

FIG. 5 is a diagram showing waveforms of the input and output signals in an ideal driver circuit.

DETAILED DESCRIPTION OF THE PREFERRED EMBODIMENTS

Figure 1:
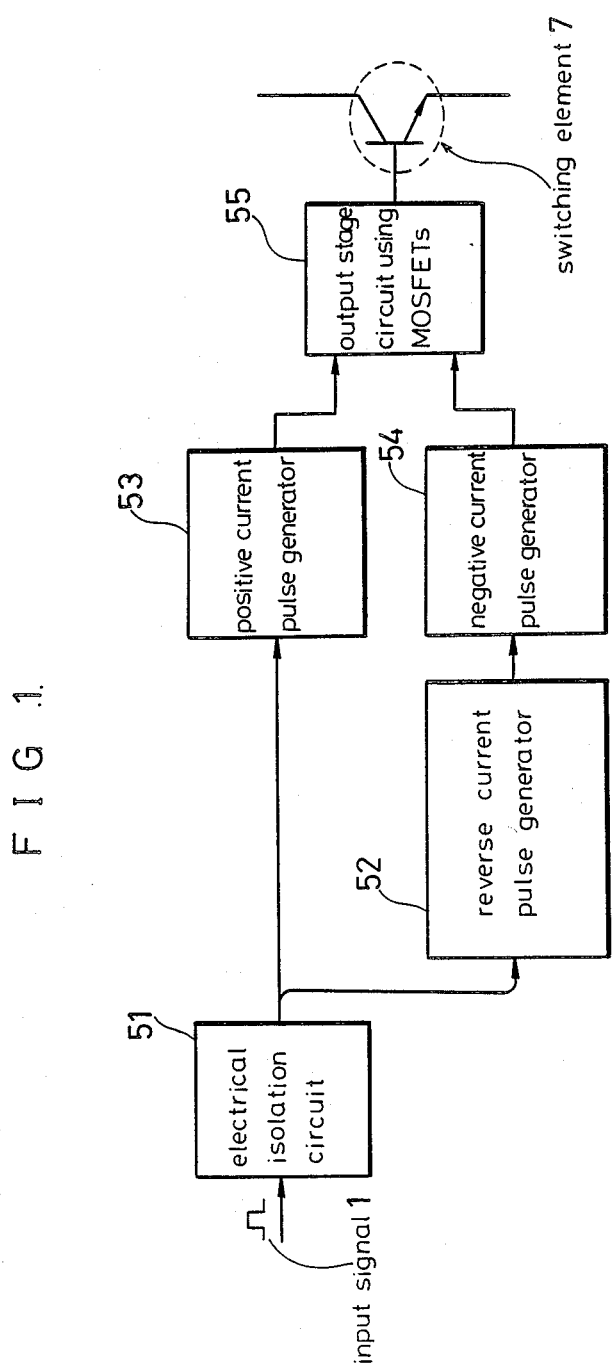
FIG. 1 is a block diagram of a driver circuit of one embodiment of the present invention.
Figure 2:
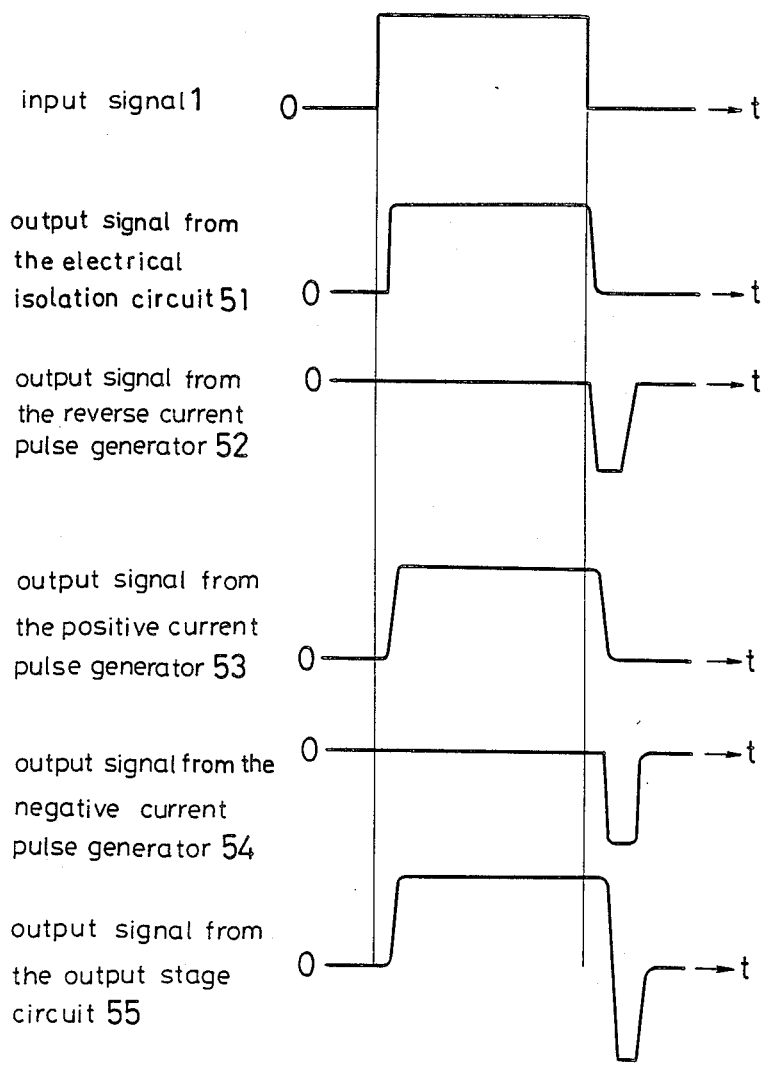
FIG. 2 is a diagram showing signal waveforms appearing at each portion of the circuit of FIG. 1.

In order to explain the present invention in detail, reference will be particularly made to Figures 1 and 2.

A driver circuit as one embodiment of the present invention is constituted by an electrical isolation circuit 51, a reverse current pulse generator 52, a positive current pulse generator 53, a negative current pulse generator 54, and an output stage circuit 55 which is constituted by MOSFETs. The electrical isolation circuit 51 receives an input signal 1, and generates an output signal which is electrically isolated from the input signal by wave-reforming the input signal. The reverse current pulse generator 52 receives the output signal from the electrical isolation circuit 51, and generates a signal falling to a negative level from the 0 level in synchronism with the fall of the output signal. The positive current pulse generator 53 generates a rising signal and a falling down signal in response to the rising up and falling of the signal from the electrical isolation circuit 51. The negative current pulse generator 54 generates a signal falling from the 0 level in response to the falling of the signal from the reverse current pulse generator 52. The output stage circuit 55 constituted by MOSFETs receives the signals from the positive current pulse generator 53 and the negative current pulse generator 54, and generates a signal for driving a switching element 7.

In the driver circuit described above, the output signal thereof is a signal obtained by the high speed operation of the MOSFETs, whereby the ideal waveform of the output signal shown in FIG. 5 can be easily obtained.

Figure 3:
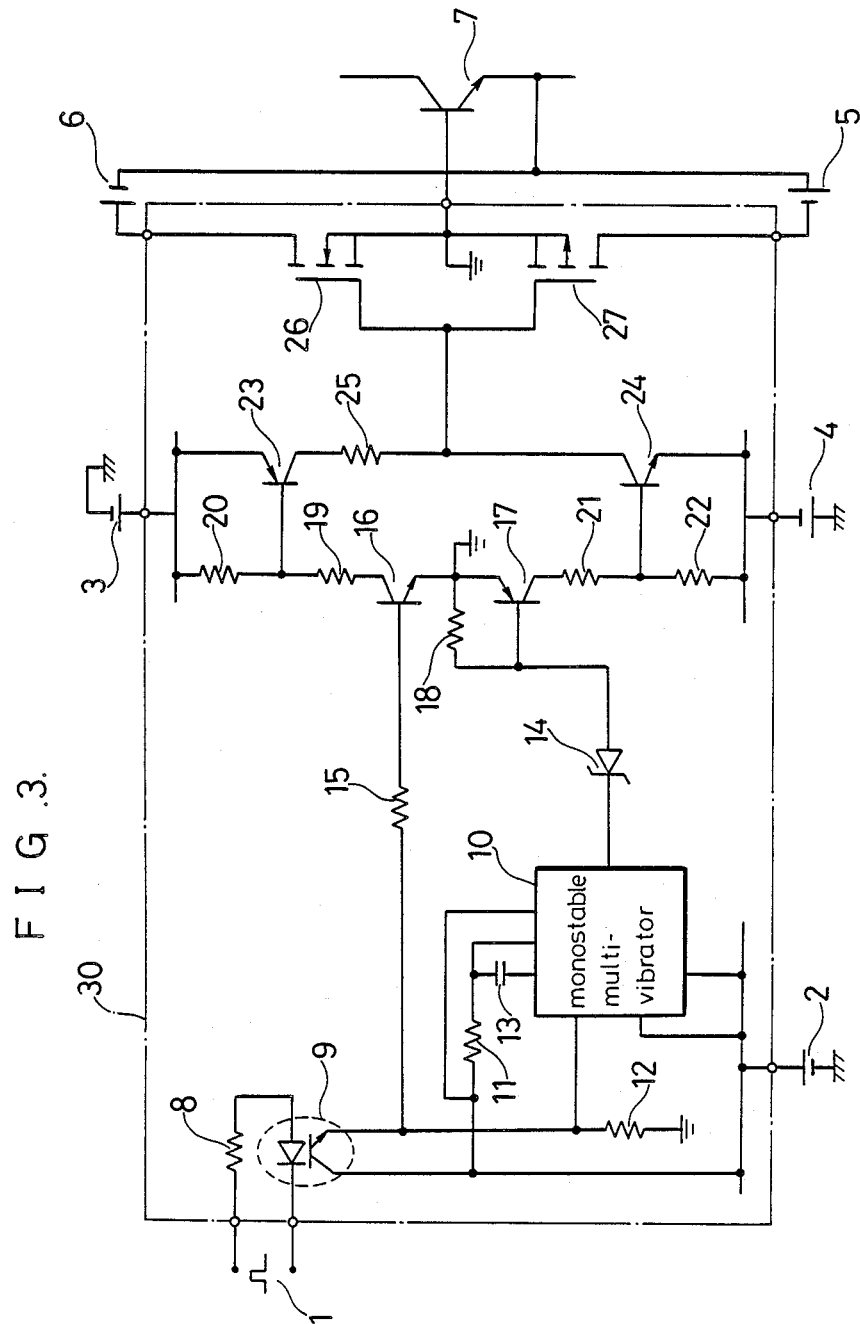
FIG. 3 is a circuit diagram detailing the construction of the circuit of FIG. 1.
Figure 4:
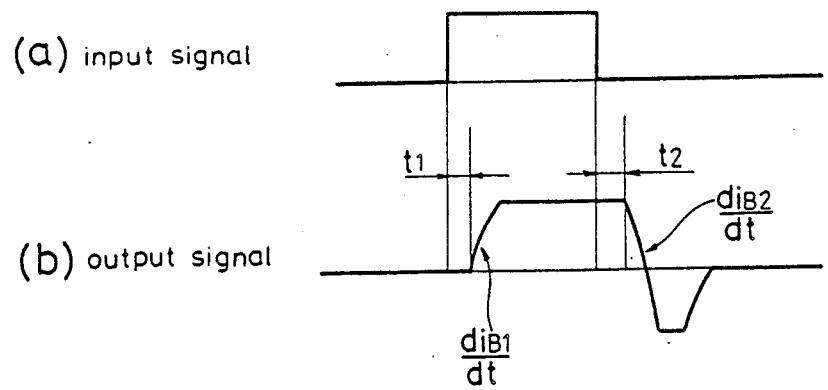
FIG. 4 is a diagram showing waveforms of the input and output signals in a prior art driver circuit.

FIG. 3 shows an example of the circuit construction of the driver circuit of FIG. 1:

The electrical isolation circuit 51 is constituted by a series connection of a photo-coupler 9 and a resistor 8 for restricting the current at the input portion of the photo-coupler 9.

The reverse current pulse generator 52 is constituted by a monostable multi-vibrator 10 provided with resistors 11 and 12 and a condenser 13. The photo-coupler 9 and the monostable multi-vibrator 10 are driven by the voltage from a power supply 2.

The positive current pulse generator 53 is constituted by an NPN transistor 16 which is turned on and off by receiving the signal from the photo-coupler 9 at the base thereof, and a PNP transistor 23 which is turned on and off synchronously with the turning on and off of the NPN transistor 16. The collector of the NPN transistor 16 is connected to a power supply 3 through resistors 19 and 20, and the emitter of the PNP transistor 23 is directly connected to the power supply 3.

The negative current pulse generator 54 is constituted by a PNP transistor 17 which is turned on and off with by receiving the signal from the monostable multi-vibrator 10 at a base thereof through a constant voltage diode 14 which is connected to the multi-vibrator 10 in a reverse direction, and an NPN transistor 24 which is turned on or off synchronously with the turning on or off of the PNP transistor 17. The collector of the PNP transistor 17 is connected to a power supply 4 through resistors 21 and 22, and the emitter of the NPN transistor 24 is directly connected to the power supply 4. Both the emitters of NPN transistor 16 and PNP transistor 17 are connected to ground, and the collectors of the PNP transistor 23 and NPN transistor 24 are connected to each other through a resistor 25, thereby to generate a signal for producing a signal for driving the switching element 7.

The output stage circuit 55 is constituted by an N channel MOSFET 26 and a P channel MOSFET 27 connected with each other in a complementary manner which are turned on and off with by receiving the signals from the positive and negative current pulse generators 53 and 52 at the gates thereof, respectively. A positive voltage is applied to the drain of the N channel MOSFET 26 by a power supply 6, and a negative voltage is applied to the drain of the P channel MOSFET 27 by a power supply 5. The sources of the MOSFETs 26 and 27 are connected with each other to form an output terminal.

The circuit of FIG. 3 is operated as follows:

The operation of turning on the switching element 7 which is typically constituted by an NPN power transistor is described first. In response to the rising of the input signal 1, a signal which is obtained by removing electrical noises from the input signal and which rises in response to the rising up of the input signal is output from the photo-coupler 9. The NPN transistor 16 is turned on by the rising of the signal from the photo-coupler 9 as a trigger signal. The PNP transistor 23 is turned on by the transition of the NPN transistor 16 to the on-state as a trigger signal. Then, a signal of the 0 level is output from the monostable multi-vibrator 10 and the PNP transistor 17 is placed in an off-state. Accordingly, the NPN transistor 24 is also in an off-state. As a result, a voltage signal which comes from the power supply 3 through the PNP transistor 23 and the resistor 25 is applied to the gates of the MOSFETs 26 and 27. The N channel MOSFET 26 is turned on, and the P channel MOSFET 26 is turned off because the signal applied to the gates is a signal of positive voltage. Accordingly, a positive base current amplified by the loop constituted by the power supply 6, the N channel MOSFET 26, the base-emitter path of the switching transistor 7, and the power supply 6 is supplied to the switching element 7, whereby the element 7 is turned on synchronously with the on-state of the MOSFET 26.

Next, the operation of turning off the switching element 7 is described. The monostable multi-vibrator 10 receives the signal from the photo-coupler 9 which falls in response to the falling of the input signal 1, and generates a signal falling from the 0 level to a negative level triggered by the falling of the input signal. The PNP transistor 17 is turned on in response to the falling of the signal from monostable multivibration 10 (the storage time of the transistor 16 should be considered). By this turning on of the PNP transistor 17, the NPN transistor 24 is turned on. Then, the transistors 16 and 23 are in off-states. Accordingly, a signal of negative level in accordance with the signal from the monostable multi-vibrator 10 is applied to the gates of the MOSFETs 26 and 27, whereby the MOSFET 26 is turned off and the MOSFET 27 is turned on. As a result, a current flows through the loop constituted by the power supply 5, the emitter-base path of the switching element 7, and the MOSFET 27, and a base reverse bias current is applied to the switching element 7, thereby turning off the switching element 7 at a high speed.

On the other hand, as apparent from the above description, the NPN transistor 16 and the PNP transistor 17 are not in on-states simultaneously as are also the PNP transistor 23 and the NPN transistor 24, and the N channel MOSFET 26 and the P channel MOSFET 27. That is, when the transistors 16, 23 and the MOSFET 26 are in on-states, the transistors 17, 24 and the MOSFET 27 are in off-states. Furthermore, when the input signal 1 is not present, the transistors 16, 17, 23, 24 and the MOSFETs 26, 27 are all in off-state.

In this way, an ideal signal for driving a switching element is obtained which has no delay against the input signal.

As evident from the foregoing, according to the present invention, MOSFETs are used at the final stage of the driver circuit, thereby reducing the delay time of the output signal against the input signal to a great extent, and to be interfaced by TTL logic. When this circuit is constituted by a hybrid IC, this effect becomes eminent.

Furthermore, the rising and falling of the base current as a driving signal given to the switching element becomes quite sharp, thereby obtaining an ideal signal as one for driving a switching element such as a power transistor.

Accordingly, the switching time for the switching element is reduced to a great extent, thereby reducing the switching loss to a great extent.

Furthermore, MOSFETs are used at the final stage of the driver circuit, whereby the total power loss of the driver circuit becomes small, and the capacity of the power supply for the driver circuit can be reduced to a great extent.

What is claimed is:

1. A circuit for driving a switching element in response to an input signal pulse from a driving signal generator, comprising:

isolation means, responsive to said input signal pulse, for producing a pulse signal electrically isolated from said input signal pulse;

first signal generator means, responsive to said electrically isolated pulse signal, for generating a first signal synchronous with said electrically isolated pulse signal;

second signal generator means comprising a monostable multivibrator, responsive to a falling edge of said electrically isolated pulse signal, for generating a second signal synchronous with the falling edge of said electrically isolated pulse signal;

third signal generator means, responsive to said second signal, for generating a third signal synchronous with said second signal; and fourth signal generator means, responsive to said first and third signals, for generating an ON signal and an OFF signal, respectively, said ON signal activating said switching element and said OFF signal disabling said switching element.

2. A circuit as defined in claim 1, wherein said switching element is a bipolar transistor, said ON signal acts to forward bias said transistor and said OFF signal acts to reverse bias said transistor.

3. A circuit as defined in claim 1, wherein the second signal generator means comprises a monostable multivibrator.

4. A circuit as defined in claim 1, wherein said first and third signal generator means each comprise a pair of a PNP transistor and an NPN transistor.

5. A circuit as defined in claim 1, wherein the fourth signal generator comprises two metal oxide semiconductor field effect transistors connected with each other in a complementary manner.

* * * * *